United States Patent
Colle et al.

(10) Patent No.: US 7,458,042 B2
(45) Date of Patent: Nov. 25, 2008

(54) DEBUGGER OF AN ELECTRIC CIRCUIT MANUFACTURED BASED ON A PROGRAM IN HARDWARE DESCRIPTION LANGUAGE

(75) Inventors: Pierre Colle, La Terrasse (FR); Olivier Potin, Montpellier (FR); Anne Wantens, Grenoble (FR); Yves Devigne, Grenoble (FR)

(73) Assignee: Temento Systems, Montbonnot Saint Martin (FR)

( * ) Notice: Subject to any disclaimer, the term of this patent is extended or adjusted under 35 U.S.C. 154(b) by 220 days.

(21) Appl. No.: 11/187,627

(22) Filed: Jul. 22, 2005

(65) Prior Publication Data
US 2006/0064678 A1    Mar. 23, 2006

(30) Foreign Application Priority Data
Jul. 29, 2004    (FR) .................................. 04 51716

(51) Int. Cl.
*G06F 17/50*    (2006.01)
(52) U.S. Cl. .............................................. 716/3; 716/4
(58) Field of Classification Search ...................... 716/3, 716/4
See application file for complete search history.

(56) References Cited
U.S. PATENT DOCUMENTS

| | | | |
|---|---|---|---|
| 5,903,466 A * | 5/1999 | Beausang et al. ............. | 716/18 |
| 6,973,631 B2 * | 12/2005 | Huang et al. .................... | 716/4 |
| 7,222,315 B2 * | 5/2007 | Schubert et al. ................ | 716/4 |
| 2003/0131325 A1 | 7/2003 | Schubert et al. | |

OTHER PUBLICATIONS

International Search Report dated Feb. 11, 2005 for related French Patent Application No. FR 04/51716 of Jul. 29, 2004.

* cited by examiner

*Primary Examiner*—Jack Chiang
*Assistant Examiner*—Brandon W Bowers
(74) *Attorney, Agent, or Firm*—Howard IP Law Group, PC

(57) ABSTRACT

A device for debugging an electronic circuit manufactured from an initial program in hardware description language, HDL, comprising an instrumentation unit capable of receiving the initial program; receiving an additional program describing determined functions; determining an additional circuit to be incorporated into the electronic circuit from the additional program, capable of setting to a determined value a signal selected from among an input signal, an output signal, or a signal internal to the additional circuit; and providing a modified program in HDL language incorporating a description in HDL language of the additional circuit; and a debugging unit capable of debugging a modified electronic circuit manufactured from the modified program, the debugging unit being capable of communicating with the additional circuit to control the setting to the determined value of the selected signal.

8 Claims, 2 Drawing Sheets

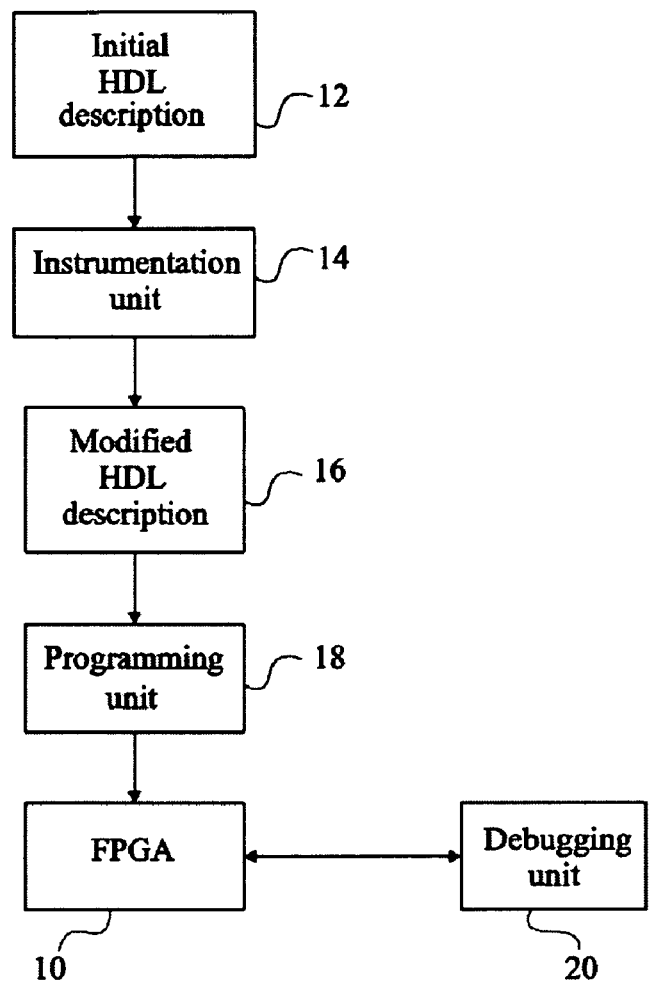
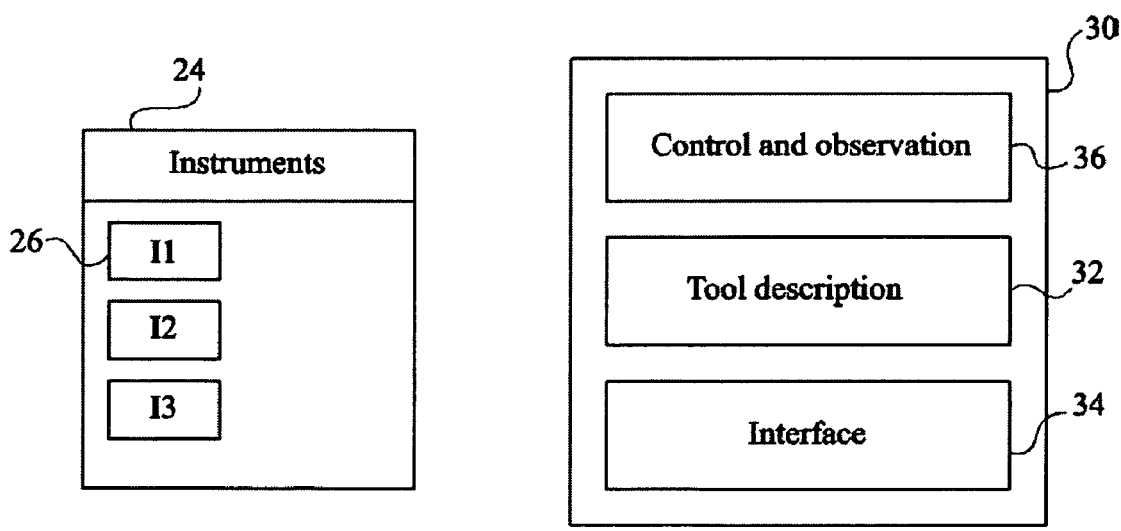
Fig 1
Fig 2
Fig 3

DEBUGGER OF AN ELECTRIC CIRCUIT MANUFACTURED BASED ON A PROGRAM IN HARDWARE DESCRIPTION LANGUAGE

This application claims the benefit of French Application No. 04/51716, filed Jul. 29, 2004, the entire disclosure of which is incorporated herein by reference.

FIELD OF THE INVENTION

The present invention relates to a device and a method for debugging an electronic circuit described by a program written in a hardware description language or HDL.

BACKGROUND OF THE INVENTION

The HDL language is a programming language which has been developed and optimized for the design and the modeling of electronic circuits since it enables accurately describing the behavior of electronic circuits. It is, for example, the VHDL language (for VHSIC Hardware Description Language, with VHSIC standing for Very High Speed Integrated Circuit), or the Verilog language.

Examples of electronic circuits formed based on HDL programs are Field Programmable Gate Array (FPGA) circuits or Application Specific Integrated circuits, or ASIC. More specifically, an FPGA circuit comprises electronic gates preimplanted on a circuit according to a given topology. In the initial state, these gates are not interconnected. To form an electronic circuit implementing specific functions based on an FPGA circuit, it is enough to create certain connections (which can be obtained by the turning-on of MOS transistors) between certain electronic gates of the FPGA to obtain the desired functions. For this purpose, a RAM, in which configuration data (bitstream) especially representing circuit connections are stored, may be used. The bitstream data are obtained from the HDL program describing the electronic circuit.

In the full design process of an electronic circuit, it is necessary to provide a debugging step which comprises the error detection, diagnosis, and correction, during the electronic circuit operation. For an electronic circuit designed based on an HDL program, an error correction may correspond to a modification of the HDL program describing the electronic circuit.

There currently exist two main types of methods for debugging an electronic circuit obtained from an HDL program.

The first method consists of using a logic analyzer. It may for example be the logic analyzer sold by Altera Company under trade name Signal TAP. A logic analyzer enables modifying the initial HDL program describing an electronic circuit to obtain a modified HDL program which describes the same electronic circuit with additional circuits which generally have no influence upon the behavior of the electronic circuit and which implement specific functions useful to debug the electronic circuit. An additional circuit may perform logic operations on given signals used by the electronic circuit and provide an alert signal when a logic condition is fulfilled, check the values of several signals in parallel, etc. The debugging of an FPGA circuit programmed from the initial HDL program is carried out by programming the FPGA circuit with the modified HDL program. The modified FPGA circuit is then operated in real time in its normal operation environment, and the logic analyzer is used to collect the different signals provided by the additional circuits added to the electronic circuit described by the initial HDL program.

The logic analyzer provides a user with a list of additional circuits from which it determines the specific functions for the electronic circuit debugging. However, the debugging functions that can be obtained are limited by the additional circuits provided by the logic analyzer. Even if more complex debugging functions are defined by combining the functions provided by the logic analyzer, not always can the user define specific debugging functions which would be particularly well adapted to the electronic circuit debugging.

The second method corresponds to a direct debugging of the HDL program. Such a debugging method may be implemented by means of the debugger sold by Synplicity Company under trade name Identify. Such a debugger enables inserting watchpoints at the level of certain parts of an initial HDL program describing an electronic circuit and providing a modified HDL program from which an FPGA circuit, for example, is programmed. On operation of the modified FPGA circuit thus programmed, the debugger exchanges signals with the FPGA circuit and can indicate to a user whether the parts of the initial HDL program marked with watchpoints have been executed during the operation of the FPGA circuit. The debugger can also indicate the value of signals used by the initial HDL program at the time when the marked parts of the initial HDL program are executed. If errors occur during the operation of the FPGA circuit, the user can locate the parts of the initial HDL program at the level of which the errors have occurred.

However, such a debugger, being purely code-oriented, does not enable building complex verification scenarios based on the values of the signals used by the FPGA circuit. The absence of a tool of logic analyzer type can make the detection of certain errors upon operation of the FPGA circuit or the determination of the origin of certain detected errors difficult.

Further, before programming of an FPGA circuit or manufacturing of an ASIC circuit, the debugging of the initial HDL program can be performed by means of a static analyzer. This is a fully automated tool, usable for any type of program, and enabling predicting the behavior on execution of a program by the sole examination of its text to detect errors in the program design. The analysis is directly performed on the HDL program and not on the way in which an FPGA circuit programmed from the HDL program operates. However, as soon as the complexity of the initial HDL program becomes significant, a static analyzer appears to be less reliable and may not detect certain errors in the initial program design. Further, such a tool does not enable taking into account certain problems inherent to the physical nature of the components of the circuit manufactured from the initial HDL program.

None of the previously-described debugging methods enables the user to freely define his own additional circuits to be incorporated to the electronic circuit associated with the initial HDL description program and which enable, on operation of the electronic circuit manufactured from the modified HDL description program, execution of specific debugging functions adapted to the debugging of the considered electronic circuit. Further, it is desirable for the user to be able, during the integrated circuit operation, to modify the value of an input signal, of an output signal, or of an internal signal used by the additional previously-defined circuits to perform a specific test.

SUMMARY OF THE INVENTION

An object of the present invention is to provide a device and a method for debugging an electronic circuit manufactured from an HDL program which eases the electronic circuit debugging operation by enabling the user to freely define the additional circuits to be incorporated to the electronic circuit and to impose the values of signals relative to the additional circuits in a debugging phase.

To achieve this object, the present invention provides a device for debugging an electronic circuit manufactured based on an initial program in hardware description language, HDL, comprising an instrumentation unit capable of receiving the initial program; receiving an additional program describing determined functions; determining an additional circuit to be incorporated into the electronic circuit based on the additional program, the additional circuit comprising at least one input terminal and/or one output terminal connected to the electronic circuit and being capable of setting to a determined value a signal selected from among a signal received at the input terminal, a signal provided at the output terminal, or a signal internal to the additional circuit; and providing a modified program in HDL language based on the initial program incorporating a description in HDL language of the additional circuit; and comprising a debugging unit capable of debugging a modified electronic circuit formed based on the modified program, the debugging unit being capable of communicating with the additional circuit to control the setting to the determined value of the selected signal.

According to an embodiment of the present invention, the input terminal and/or the output terminal are connected to another additional circuit to be incorporated into the electronic circuit.

According to an embodiment of the present invention, the additional program is written in a language different from the HDL language, the instrumentation unit comprising a means for converting the additional program into HDL language.

According to an embodiment of the present invention, the additional circuit comprises a multiplexer controlled by a control signal and receiving at a first input the additional circuit signal and at a second input the determined value, the debugging unit being capable of providing the additional circuit with the value of the control signal.

According to an embodiment of the present invention, the additional circuit is capable of providing a signal representative of the selected signal, the debugging unit further comprising a display screen and being capable of displaying on the display screen the value of the representative signal.

According to an embodiment of the present invention, the electronic circuit is a programmable gate array circuit programmed from the initial program and the modified electronic circuit is a programmable gate array circuit programmed from the modified program.

The present invention also provides a method for debugging an electronic circuit manufactured based on an initial program in hardware description language, HDL, comprising the steps of receiving an additional program describing determined functions; determining an additional circuit to be incorporated into the electronic circuit based on the additional program, the additional circuit comprising at least one input terminal and/or one output terminal connected to the electronic circuit and being capable of setting to a determined value a signal selected from among a signal received at the input terminal, a signal provided at the output terminal, or a signal internal to the additional circuit; providing a modified program in HDL language based on the initial program incorporating a description in HDL language of the additional circuit; manufacturing a modified electronic circuit from the modified program; and debugging the modified electronic circuit by setting, at a determined time, the selected signal to the determined value via the additional circuit.

According to an embodiment of the present invention, the determined functions are debugging, test, and/or verification function.

The foregoing and other objects, features, and advantages of the present invention will be discussed in detail in the following non-limiting description of specific embodiments in connection with the accompanying drawings.

BRIEF DESCRIPTION OF THE FIGURES

Understanding of the present invention will be facilitated by consideration of the following detailed description of the preferred embodiments of the present invention taken in conjunction with the accompanying drawings, in which like numerals refer to like parts and in which:

FIG. 1 generally illustrates the steps of an example of implementation of the debugging method according to the present invention;

FIG. 2 schematically shows an example of a graphic interface of the debugging device according to the present invention upon preparation of a debugging operation;

FIG. 3 schematically shows an example of forming of the debugging tool according to the present invention;

FIGS. 5A, 5B to 7A, 7B show examples of the forming of the debugging tool according to the present invention.

DETAILED DESCRIPTION

Figure 4:
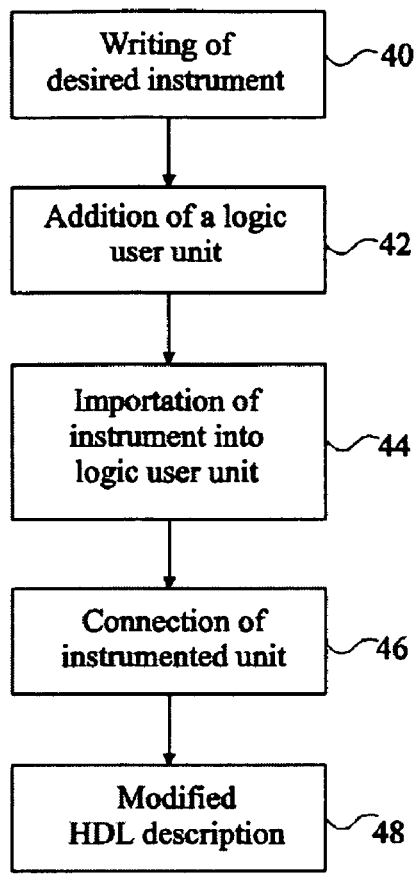
FIG. 4 illustrates the steps of an example of a method for forming the debugging tool according to the present invention.

Same elements have been designated with same reference numerals in the different drawings. For clarity, only those elements which are necessary to the understanding of the present invention have been shown.

FIG. 1 illustrates, in the form of a block diagram, an example of implementation of the debugging method according to the present invention. In the following description, the debugging method according to the present invention will be described for the debugging of an FPGA circuit 10 which is desired to be programmed based on an initial HDL program 12. However, the present invention also applies to the debugging of a dedicated electronic circuit, for example, of ASIC type, manufactured based on initial HDL program 12.

The debugging method according to the present invention comprises an instrumentation unit 14 capable of receiving the initial HDL program and of providing a modified HDL program 16 based on the initial HDL program 12 according to instructions provided by a user, as described in more detail hereafter. For this purpose, instrumentation unit 14 comprises a man/machine interface comprising, for example, a display screen, a mouse, and a keyboard, or any other adapted means.

Modified HDL program 16 is then provided to a programming unit 18 conventionally capable of programming FPGA circuit 10 based on modified HDL program 16 and the operation of which will not be described in further detail.

The debugging device according to the present invention comprises a debugging unit 20 which, upon operation of the FPGA circuit programmed based on the modified HDL program, is capable of exchanging data with FPGA circuit 10 and of providing the user with indications as to the progress of the debugging operation via the man/machine interface. The data exchange between debugging unit 20 and FPGA circuit 10 is, for example, performed via dedicated pins of FPGA circuit 10, according to the JTAG test protocol defined by IEEE standard 1149.1.

FIG. 2 shows an example of display on the display screen of the instrumentation unit 14 used to modify the initial HDL program 12. A window 24, called the Instrument window, provides the user with a block list 26, each block being associated with a debugging tool capable of helping the user in the debugging operation. These may be tools provided by the logic analyzer sold by Temento Company under trade named DLI. As an example, the tools provided by instrumentation unit 14 especially correspond to the following non-exhaustive list:

- a tool receiving input signals and providing one or several output signals by performing logic operations on the input signals, the logic operations being possibly defined by the user;
- a tool simultaneously comparing the values of several input signals with predefined values and indicating, for example, by providing an output signal in the active state, whether the values of the input signals are, at a given time, equal to the predefined values;
- a tool observing the time variation of a signal and indicating whether the sequence of values taken by the observed signal corresponds to a sequence of predefined values;
- a tool observing the time variation of a signal and indicating whether the observed signal exhibits a transient pulse; and
- a tool analyzing the data flows on buses of the electronic circuit, for example, by measuring the bit rate on the bus or the bus occupation.

The user may select some tools from among the provided tools and define which signals supply these tools. The user may also interconnect the tools, an output of a tool driving an input of another tool. This enables the user to obtain more complex debugging tools based on the tools initially provided by instrumentation unit 14.

The present invention consists of providing a specific tool, called a logic user tool, enabling the user to freely and easily define the functions to be performed by the tool in a debugging operation and which enables the user, in the debugging operation, to control the value of one or of several signals used by the tool that he has defined.

FIG. 3 schematically shows the elements forming logic user unit 30. The functions which will be executed by logic user unit 30 in a debugging operation are defined by a tool description program 32, in HDL language, obtained from a program written by the user. Logic user unit 30 comprises an interface unit 34 which enables connecting the input/output signals of tool description program 32 to other signals of initial HDL description 12 or to signals associated with other debugging tools. Further, logic user unit 30 comprises a control and observation unit 36 which enables controlling and/or observing the value of one or several input signals, output signals, or internal signals of tool description program 32.

FIG. 4 describes steps of an example of a method for forming a tool based on logic user unit 30.

At step 40, the user writes, in an appropriate language, a basic program defining the test, debugging, and/or verification functions that the tool must execute in a debugging phase. It may be the HDL description language, which is particularly well adapted to the writing of debugging functions, or the PSL Sugar or Verilog System language, particularly well adapted to the writing of so-called assertion functions consisting of verifying that an expected property is verified. The basic program must comprise interface signals intended to be connected to other signals (for example, signals of initial HDL description 12 or input/output signals of tools already incorporated in initial HDL description 12). Further, one of the input signals of the basic program must correspond to a clock signal which, in a debugging phase, is especially used by control and observation unit 36 for the sampling of the observed signals.

At step 42, the user adds a logic user unit 30 to the tools that he has already connected to initial HDL description 12. At this time, logic user unit 30 does not yet comprise a tool description program 32.

At step 44, the user incorporates the basic program defined at step 40 in logic user unit 30 as a tool description program 32. Instrumentation unit 14 converts, if need be, the basic program into HDL language. Further, instrumentation unit 14 displays on the display screen the input and output signals and the internal signals associated with the tool description program.

At step 46, the user connects, at his convenience, the input/output signals of tool description program 32 to signals used by initial HDL description 12 or to input/output signals of tools that the user has already connected to initial description 12. Further, the user connects the clock signal of logic tool unit 30 to the clock signal used in the initial HDL description 12, or to one of the clock signals used in initial HDL description 12. The user then connects, to control and observation unit 36, the input signals, the output signals and/or the signals internal to tool description program 32 that he would like to observe in the subsequent debugging step. Finally, the user connects, to control and observation unit 36, the input signals, the output signals and/or the internal signals of logic user unit 30, the value of which he desires to be able to impose in the subsequent debugging step.

At step 48, instrumentation unit 14 modifies tool description program 32 to take into account signals to be observed or to be controlled and then modifies initial HDL description 12 to include therein the description in HDL language of logic user unit 30. An FPGA circuit is then programmed from modified HDL description 16.

In the subsequent debugging phase, debugging unit 20 can display on the display screen the values of the observed input signals, output signals, or internal signals, in the form of a timing diagram or in the form of digital values, each digital value being associated with a symbol representative of the considered signal, for example, a virtual light-emitting diode. The user can then easily visualize the results of the test, debugging, and/or verification functions executed by the logic user unit 30 that it has incorporated to initial HDL description 12. In the debugging step, the user may further, at any time, set the values independently from one another of the input/output signals or of the internal signals of logic user unit 30 that it has previously specified as being signals to be controlled.

For the observation and the control of the signals associated with logic user unit 30, debugging unit 20 uses, for example, the access terminals of the FPGA circuit dedicated to test protocol JTAG defined by standard IEEE 1149.1. More specifically, for the observation of signals, an observation register having the size of the number of signals to be observed is provided at the level of the programmed FPGA circuit. By means of the instructions conventionally used by the JTAG test protocol, the value of the signals to be observed in the observation register, the bits of which are transmitted in series to debugging unit 20 by terminal TDO of the FPGA circuit dedicated to the JTAG test protocol, is captured. The signal capture is performed synchronously with the clock that has been specified for logic user unit 30. This enables sampling the values of the signals to be observed while being certain that they are not changing.

The control of an input/output signal or of an internal signal of tool description program 32 is obtained by the addition, in the circuit described by tool description program 32, of a multiplexer, of two new input signals, that is, a signal $S_{COM}$ which corresponds to the value which is desired to be imposed to a signal to be controlled and a signal $S_{MUX}$ which controls the multiplexer, and of a new internal signal $S_{NEW}$. According to an exemplary embodiment, a control register formed of a number of bits equal to twice the number of signals which is desired to be controlled, that is, equal to the number of signals $S_{COM}$ and $S_{MUX}$, is provided at the level of a programmed FPGA circuit. In a debugging phase, the values of $S_{COM}$ and $S_{MUX}$ are provided in series by debugging unit 20 to the control register by terminal TDI of the FPGA circuit dedicated to the JTAG test protocol. The new values are then effectively transmitted to logic user unit 30 synchronously with the clock signal that has been specified for logic user unit 30. By modifying, in the debugging step, the value of one or several input/output signals and/or internal signals implemented by logic user unit 30, different tests can be executed in a same debugging step at the normal operating speed of the FPGA circuit programmed with the modified HDL description.

FIGS. 5A, 5B to 7A, 7B schematically illustrate examples of implementation of the signal control of tool description program 32.

Figure 5A:
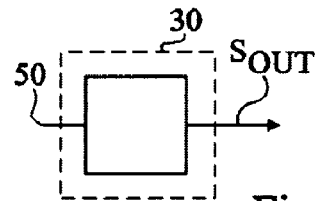

FIG. 5A shows a logic user unit 30 containing an internal element 50 defined from the basic program written by the user and which provides an output signal $S_{OUT}$ of logic user unit 30, the value of which is desired to be imposed.

Figure 5B:
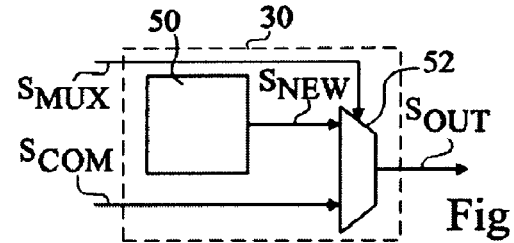

FIG. 5B shows a drawing analog to FIG. 5A in which a multiplexer 52 is placed downstream of element 50. The new internal signal $S_{NEW}$ corresponds to the signal provided by element 50 and drives a first input of multiplexer 52 which provides output signal $S_{OUT}$. Signal $S_{COM}$ drives a second input of multiplexer 52 and signal $S_{MUX}$ controls multiplexer 52.

Figure 6A:
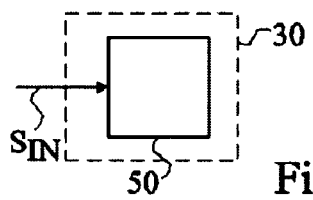

FIG. 6A shows a logic user unit 30 containing an internal element 50 defined from a basic program written by the user and which receives an input signal $S_{IN}$ of logic user unit 30, the value of which is desired to be imposed.

Figure 6B:
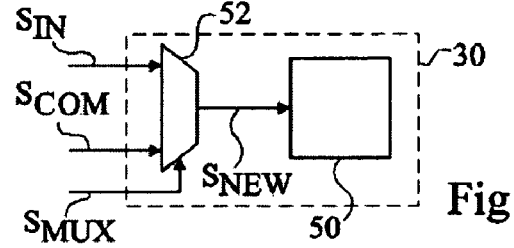

FIG. 6B shows a drawing analog to FIG. 6A in which multiplexer 52 is placed upstream of element 50. The new internal signal $S_{NEW}$ corresponds to the signal provided by multiplexer 52 and drives internal element 50. Input signal $S_{IN}$ drives a first input of multiplexer 52, signal $S_{COM}$ drives a second input of multiplexer 52, and signal $S_{MUX}$ controls multiplexer 52.

Figure 7A:
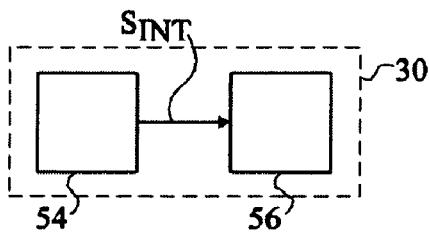

FIG. 7A shows a logic user unit 30 containing a first internal element 52 providing an internal signal $S_{INT}$ to a second internal element 54, the first and second internal elements 52, 54 being defined from the basic program written by the user. The value of internal signal $S_{INT}$ is desired to be imposed.

Figure 7B:
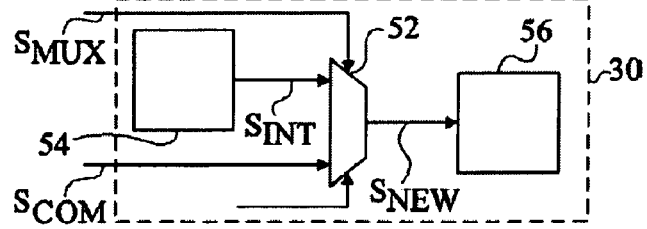

FIG. 7B shows a drawing analog to FIG. 7A in which multiplexer 52 is placed between internal elements 52, 54. The new internal signal $S_{NEW}$ is provided by multiplexer 52 to second internal element 56. Internal signal $S_{INT}$ drives a first input of multiplexer 52. Signal $S_{COM}$ drives a second input of multiplexer 52 and signal $S_{MUX}$ controls multiplexer 52.

In its simplest expression, logic user unit 30 consists of a single multiplexer comprising a first input connected to the signal, the value of which is desired to be imposed, that is, a signal of initial HDL description 12 or an input or output signal of another tool incorporated to initial HDL description 12, and a second input receiving signal $S_{COM}$. Logic user unit 30 also receives signal $S_{MUX}$ which controls multiplexer 52.

More generally, the present invention enables performing tests according to specific scenarios that the user can precisely adapt to the initial HDL description. It is, for example, the verification of a complex state machine. Indeed, it would be difficult to define such a verification operation via a graphic interface while the writing of such a verification operation by a conventional programming language is generally simple and fast. The scenarios may implement test, debugging, and/or verification functions that may be used jointly or separately. Further, in a debugging phase, the user may separately or simultaneously control the signals connected to the control and observation unit of the logic user unit. The user can thus easily apply specific test vectors directly in the FPGA circuit.

An HDL program may implement several control clock signals used to synchronize different parts of the FPGA circuit programmed based on the HDL program. Each logic user unit is then advantageously controlled by the control clock signal which has the highest frequency and the measurement of the observed signals is performed at the highest control clock signal frequency so that any state switching of an observation signal is captured.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for debugging an electronic circuit manufactured from an initial program in hardware description language, HDL, comprising:
   an instrumentation unit capable of
      receiving the initial program;
      receiving an additional program describing determined functions;
      determining an additional circuit to be incorporated into the electronic circuit from said additional program, said additional circuit comprising at least one input terminal and/or one output terminal connected to the electronic circuit and being capable of setting to a determined value a signal selected from among a signal received at said input terminal, a signal provided at said output terminal, or a signal internal to said additional circuit; and
      providing a modified program in HDL language from the initial program incorporating a description in HDL language of the additional circuit; and
   a debugging unit capable of debugging a modified electronic circuit formed from the modified program, the debugging unit being capable of communicating with the additional circuit to control the setting to said determined value of said selected signal.

2. The device of claim 1, wherein the input terminal and/or the output terminal are connected to another additional circuit to be incorporated into the electronic circuit.

3. The device of claim 1, wherein the additional program is written in a language different from the HDL language, the instrumentation unit comprising means for converting the additional program into HDL language.

4. The device of claim 1, wherein the additional circuit comprises a multiplexer controlled by a control signal and receiving at a first input said additional circuit signal and at a second input said determined value, the debugging unit being capable of providing said additional circuit with the value of the control signal.

5. The device of claim 1, wherein the additional circuit is capable of providing a signal representative of the selected signal, the debugging unit further comprising a display screen and being capable of displaying on the display screen the value of the representative signal.

6. The device of claim 1, wherein the electronic circuit is a programmable gate array circuit programmed from the initial program and the modified electronic circuit is a programmable gate array circuit programmed from the modified program.

7. A method for debugging an electronic circuit manufactured from an initial program in hardware description language, HDL, comprising the steps of:

receiving an additional program describing determined functions;

determining an additional circuit to be incorporated into the electronic circuit from said additional program, said additional circuit comprising at least one input terminal and/or one output terminal connected to the electronic circuit and being capable of setting to a determined value a signal selected from among a signal received at said input terminal, a signal provided at said output terminal, or a signal internal to said additional circuit;

providing a modified program in HDL language from the initial program incorporating a description in HDL language of the additional circuit;

manufacturing a modified electronic circuit from the modified program; and debugging the modified electronic circuit by setting, at a determined time, the selected signal to said determined value via the additional circuit.

8. The method of claim 7, wherein the determined functions are debugging, test, and/or verification function.

* * * * *